(12) United States Patent
Beier et al.

(10) Patent No.: US 11,520,790 B2
(45) Date of Patent: Dec. 6, 2022

(54) PROVIDING CHARACTER ENCODING

(71) Applicant: International Business Machines Corporation, Armonk, NY (US)

(72) Inventors: Felix Beier, Haigerloch (DE); Knut Stolze, Hummelshain (DE); Luis Eduardo Oliveira Lizardo, Boeblingen (DE); Reinhold Geiselhart, Rottenburg-Ergenzingen (DE)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 17/024,108

(22) Filed: Sep. 17, 2020

(65) Prior Publication Data
US 2022/0083554 A1 Mar. 17, 2022

(51) Int. Cl.
*G06F 16/245* (2019.01)
*G06F 16/2455* (2019.01)
*H03M 7/30* (2006.01)

(52) U.S. Cl.
CPC .. *G06F 16/24553* (2019.01); *G06F 16/24552* (2019.01); *H03M 7/3088* (2013.01)

(58) Field of Classification Search
None
See application file for complete search history.

(56) References Cited

U.S. PATENT DOCUMENTS

| | | | |
|---|---|---|---|
| 6,415,295 B1 * | 7/2002 | Feinberg | G06F 16/22 |
| 7,872,596 B2 | 1/2011 | Schneider | |
| 2013/0060780 A1 * | 3/2013 | Lahiri | G06F 16/221 |
| | | | 707/E17.037 |
| 2015/0178305 A1 * | 6/2015 | Mueller | G06F 16/17 |
| | | | 707/693 |
| 2017/0109406 A1 | 4/2017 | Chavan | |
| 2018/0081939 A1 * | 3/2018 | Hopeman | G06F 16/221 |
| 2019/0155930 A1 * | 5/2019 | Fender | G06F 16/2282 |
| 2019/0391978 A1 | 12/2019 | Liu | |
| 2020/0097571 A1 * | 3/2020 | Mathur | G06F 16/2365 |
| 2020/0133866 A1 * | 4/2020 | Das | G06F 16/245 |
| 2022/0129430 A1 * | 4/2022 | Trimble | G06F 16/1744 |

OTHER PUBLICATIONS

"Database Globalization Support Guide: Choosing a Character Set", Oracle Database Online Documentation 12c, Release 1 (12.1), Copyright © 1996, 2017, Oracle and/or its affiliates., 29 pps., <https://docs.oracle.com/database/121/NLSPG/ch2charset.htm#NLSPG002>.

* cited by examiner

*Primary Examiner* — Son T Hoang
(74) *Attorney, Agent, or Firm* — Stephanie L. Carusillo (57) ABSTRACT

In an approach for character encoding, a processor receives a first query involving an attribute, wherein the first query utilizes a value encoded in accordance with a first encoding scheme. A processor identifies a table comprising values of the attribute in a compressed format. A processor creates at least one dictionary associated with the attribute, wherein the at least one new dictionary associated with the attribute maps a compressed value to a corresponding uncompressed value. A processor executes the first query by invoking a conversion operation in a query plan of the first query for decoding one or more queried values of the attribute. A processor fills the at least one new dictionary with one or more decoded query values to create at least one full dictionary. A processors stores the at least one full dictionary in a cache using a predefined cache management policy of the cache.

17 Claims, 4 Drawing Sheets

PROVIDING CHARACTER ENCODING

BACKGROUND OF THE INVENTION

The present invention relates generally to the field of digital computer systems, and more particularly to character encoding.

A metadata catalog may be a set of tables, such as a dictionary, that contains information about how to convert data. A database management system (DBMS) can use a dictionary to determine how to execute database queries submitted to the DBMS. The database queries may require access to column values that are defined by the dictionary.

SUMMARY

Aspects of the present invention disclose a method, computer program product, and system for character encoding. The method includes one or more processors receiving a first query involving an attribute. The first query utilizes encoded in accordance with a first encoding scheme. The method further includes one or more processors identifying a table comprising values of the attribute in compressed format. The method further includes one or more processors creating at least one dictionary, the dictionary mapping a compressed value of the attribute to a corresponding uncompressed value that is encoded in accordance with the first encoding scheme. The method further includes one or more processors storing the dictionary in a cache using a predefined cache management policy of the cache.

BRIEF DESCRIPTION OF THE DRAWINGS

In the following embodiments of the invention are explained in greater detail, by way of example only, making reference to the drawings.

DETAILED DESCRIPTION

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

When tables are created in a database system, a character encoding (also referred to as encoding scheme), such as American Standard Code for Information Interchange (ASCII), UNICODE, Extended Binary Coded Decimal Interchange Code (EBCDIC), or others, may be specified for encoding string column values. The character encoding can be done on table-level for all columns or for individual columns when tables are created. The encoding scheme may define the interpretation of byte values and collating sequences for query processing.

Embodiments of the present invention can provide character encoding. The character encoding can be provided as a dictionary scheme for at least one given table column or attribute. A dictionary may be a mapping from a column value to another value that requires storage of less bytes, which can enable reuse of dictionary compression methods that the DBMS can apply. That is, the character encoding may be represented as a dictionary compression scheme for a given table column. For query processing, some operations, such as filters, may be directly evaluated on the dictionary encoded values. The dictionary may be advantageous as the dictionary may enable an efficient and systematic execution of queries.

According to one embodiment, the dictionary is automatically created upon receiving a first query involving the attribute. The first query can require values of the attribute encoded in accordance with the first encoding scheme. For example, the execution of the first query may use the first encoding scheme to interpret the uncompressed values of the attribute into real characters. The compressed value of an attribute may require storage of less bytes compared to the uncompressed value of the attribute, which can enable a dynamic and on-demand creation of the dictionary.

In addition, storage and utilization of the compressed value can save processing resources that would otherwise be required to generate unnecessary dictionaries. For example, embodiments can utilize less processing resources due to the reduction in the need to create dictionaries manually, and in advance, for all possible result encoding schemes, which can prevent a memory overhead of dictionaries that will not be needed for query processing. The processing overhead for creating a dictionary may, for example, be moved to the first query that needs the processing resources (e.g. in a pay-per-use model). Subsequent queries may benefit from a speedup when the required dictionaries can be reused. This embodiment may be implemented even if a DBMS does not use dictionary encoding for storing physical column values. In this case, the dictionaries may be created on-demand for re-encoding purposes.

According to one embodiment, providing the dictionary includes creating an empty dictionary associated with the attribute, and executing the received first query. The execution of the first query can include invoking a conversion operation in a query plan of the first query for decoding queried values (e.g. that are stored in the computer system) of the attribute and filling the dictionary with the decoded values. The decoded values may be encoded in accordance with the first encoding scheme. This embodiment may enable the dynamic creation of dedicated dictionaries during query processing for a specific encoding scheme, where the specific encoding scheme is different from existing encoding schemes. For example, when a query is executed in a DBMS that requires a column encoding scheme that is not available in the column dictionary, embodiments of the present invention can create a new dictionary (on-the-fly) for this particular encoding while the query runs.

According to one embodiment, the method further includes receiving a second query involving the attribute and requiring values encoded with the first encoding scheme and executing the second query. The execution of the second query includes determining if the dictionary includes queried values (e.g. that are in uncompressed format in accordance with the first encoding scheme) of the attribute. In case the dictionary does not include queried values, the method further includes invoking a conversion operation in a query plan of the second query for decoding/converting the queried values (e.g. that are stored in the computer system) and filling the dictionary with the decoded values. In case the dictionary includes queried values, embodiments of the present invention can utilize the dictionary for obtaining the queried values.

According to one embodiment, the process of creating the dictionary includes encoding all unique values of the attribute of the table in accordance with the first encoding scheme and storing at least the encoded values in the dictionary. For example, upon receiving the first query, the dictionary is provided by stopping the first query, creating the dictionary, and then resuming the first query. The first query may, for example, be executed using the created dictionary.

According to one embodiment, the method further includes storing the dictionary in a cache, where the storing of the dictionary is performed using a predefined cache management policy of the cache. The dynamically created dictionary may be cached inside the database management system to speed-up future queries using the same specific encoding scheme. The cache may limit memory consumption to a fixed value, evicting unused dictionaries using a known cache management strategy, such as last recently used (LRU), LRU-k, etc.

According to one embodiment, providing the dictionary can further include pausing execution of one or more concurrent queries of the first query. In an example, each query of the one or more concurrent queries can involve the attribute. Upon determining that the first query is finished, the concurrent queries may be notified of the existence of the dictionary. Further, the one or more queries may be executed using the dictionary.

According to one embodiment, the providing of the dictionary includes extending an existing dictionary by the dictionary. The existing dictionary is configured to map a compressed value of the attribute to a corresponding value that is encoded in accordance with an initial encoding scheme.

The process of extending an existing dictionary can change the character encoding of a table column without re-creating the table. Further, extending an existing dictionary may allow to specify multiple encoding schemes for the same column that can be dynamically selected for query processing. Further, multiple dictionaries may be defined for a single column so that the same column values can be represented in different encoding schemes. In order to add a new dictionary encoding for an existing column, embodiments of the present invention can create a new dictionary containing an entry for each unique column value of the attribute. During query processing, the column data may be interpreted using the dictionary representing the desired output character encoding scheme.

In addition, the embodiment of extending an existing dictionary may be advantageous for the following reasons. Changing the encoding may not require re-creating the table with the target encoding. In addition, when data is migrated/replicated from one DBMS to another DBMS, a desired different encoding scheme may often be required. For example, in the IBM Db2 Analytics Accelerator, a Db2 for z/OS is used as system-of-record DBMS, while the accelerator DBMS stores a copy of the data. Some customer applications may require accelerator-only access and need data in another encoding scheme, (e.g., UNICODE) compared to what is used in the Db2/z source system (e.g., EBCDIC). Various embodiments of the present invention can enable encoding schemes that may be required for such data migration.

When multiple tables are accessed in a query, embodiments of the present invention can enable to join the multiple tables over columns in a different encoding scheme instead of using costly re-encoding operations that need to be injected into the query plan.

According to one embodiment, the method further includes storing the two dictionaries separately or in a same dictionary having a column per encoding scheme.

According to one embodiment, the providing of the dictionary further includes providing another dictionary, the other dictionary being configured to map a compressed value of the attribute to a corresponding value that is encoded in accordance with a second encoding scheme. That is, for at least one column, multiple dictionaries may be defined so that the same column values are represented in different encoding schemes.

According to one embodiment, the method further includes storing the at least one dictionary separately or in a same dictionary having a column per encoding scheme.

Figure 1A:
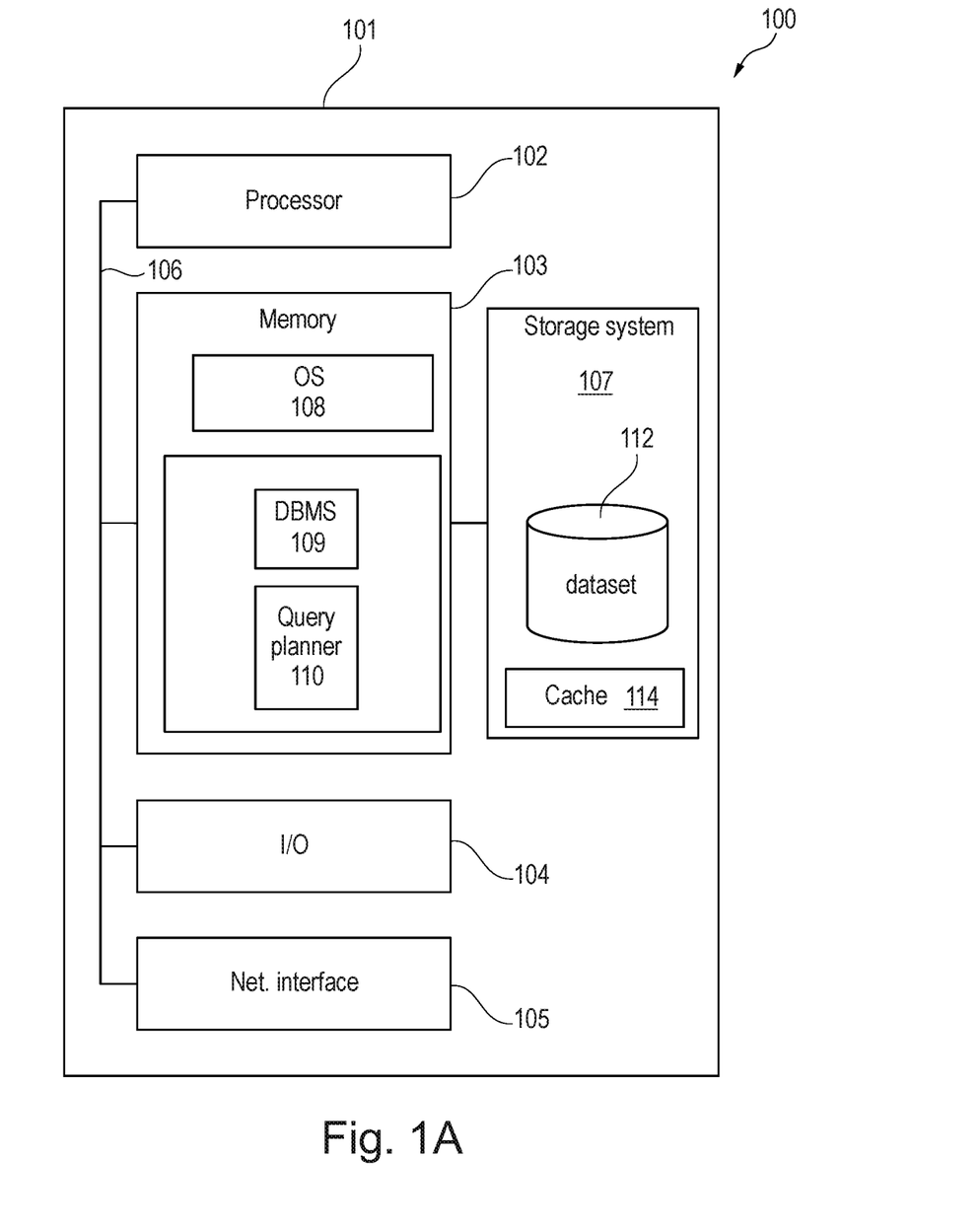
FIG. 1A is a diagram of an example computer system, in accordance with embodiments of the present invention.

FIG. 1A is a block diagram for a data processing system 100, suited for implementing method steps, in accordance with embodiments of the present invention. The data processing system 100 includes a computer system 101 (also referred to as database engine). For example, the computer system 101 can be representative of, or include, a server computer system, a mainframe computer system, or other computer systems capable of operating in accordance with embodiments of the present invention. The computer system 101 may be responsible for lookup in transactional workloads (OLTP) or be responsible for data scans in the scope of analytical applications (OLAP), which may require to read large amounts of data in a single query.

The computer system 101 includes processor 102, memory 103, I/O circuitry 104 and network interface 105 coupled together by bus 106. Processor 102 may represent one or more processors (e.g. microprocessors). The memory 103 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM)). Note that the memory 103 can have a distributed architecture, where various components are situated remote from one another, but can be accessed by the processor 102.

Memory 103 in combination with storage system 107 may be used for local data and instruction storage. Storage system 107 includes one or more persistent storage devices and media controlled by I/O circuitry 104. Storage system 107 may include magnetic, optical, magneto optical, or solid-state apparatus for digital data storage, for example, having fixed or removable media. Sample devices include hard disk drives, optical disk drives and floppy disks drives. Sample media include hard disk platters, CD-ROMs, DVD-ROMs, BD-ROMs, floppy disks, and the like. Storage system 107 may further include a cache 114.

Memory 103 may include one or more separate programs, such as database management system (DBMS) 109 and query planner 110, each of which comprises an ordered listing of executable instructions for implementing logical functions, notably functions involved in embodiments of the present invention. The software in memory 103 shall also typically include a suitable operating system (OS) 108. The OS 108 essentially controls the execution of other computer programs for implementing at least part of methods as described herein.

DBMS 109 may have access to and/or control of a dataset 112 stored in storage system 107. For example, the dataset 112 may include transaction data that provides real time or near real time transaction data for OLTP analysis, such as postings from a manufacturing control system. The dataset 112 may be stored in different format. The formats may differ in encryption, compression, row-oriented vs. column-oriented storage, etc.

Figure 1B:
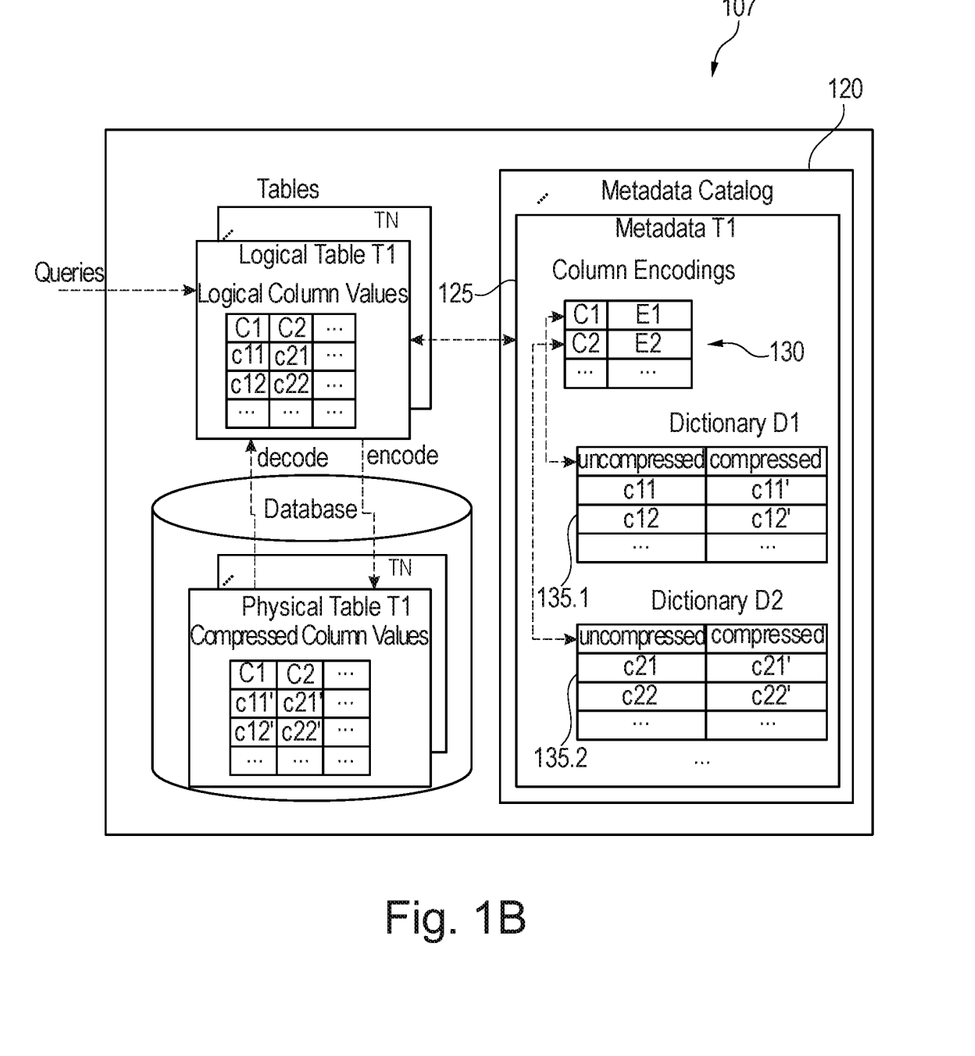
FIG. 1B is a block diagram illustrating the structure of the data, in accordance with embodiments of the present invention.

FIG. 1B depicts an example persistent content of the storage system 107, in accordance with embodiments of the present invention. FIG. 1B shows an example format of the dataset 112, in accordance with various embodiments of the present invention. The dataset 112 may comprise one or more tables $T1...TN$, that may be managed by the DBMS 109. For example, each table of the tables $T1...TN$ comprises one or more columns or attributes $C1...Cn$. In an example, the type of the values of the columns $C1...Cn$ can be a string type. In another example, the columns can be named character columns. In example embodiments, each column of the columns $C1...Cn$ has compressed values. The terms column and attribute are interchangeably used. For example, table $T1$ includes compressed values $C11'$, $C12'$ . . . of the character column $C1$ and compressed values $C21'$, $C22'$ . . . of the character column $C2$.

For simplification of the description, FIG. 1B shows details of a single table $T1$ and two columns $C1$ and $C2$ but is not limited to that number of tables or columns. For encoding character columns $C1...Cn$, a respective character encoding scheme $E1...En$ is defined on table creation. Various embodiments of the present invention can utilize one encoding for one column. For example, on creation of the table $C1...Cn$, the encoding schemes $E1$ and $E2$ associated with the character columns $C1$ and $C2$ may be defined. A mapping between the character encodings and the associate character columns may be stored in a table 130 as part of metadata 125 of the table $T1$. The metadata 125 of the table $T1$ and other tables may be stored in a metadata catalog 120.

Further, the DBMS 109 manages compression dictionaries (also named dictionaries) $D1...Dn$, one for each column $C1...Cn$ in order to map each compressed value to a corresponding uncompressed value in its corresponding character encoding. For example, for the dictionary $D1$, 135.1 of the character column $C1$ maps compressed values $C11'$, $C12'$ . . . of the column $C1$ to corresponding uncompressed values $C11$, $C12$ . . . . The uncompressed values $C11$, $C12$ . . . are provided in accordance with the encoding scheme $E1$ associated with the column $C1$. For the dictionary $D2$, 135.2 of the character column $C2$ maps compressed values $C21'$, $C22'$ . . . of the column $C2$ to corresponding uncompressed values $C21$, $C22$ . . . . The uncompressed values $C21$, $C22$ . . . are provided in accordance with the encoding scheme $E2$ associated with the column $C2$. Each compressed value of an attribute or column may occupy a storage space smaller than a storage space occupied by the corresponding uncompressed value of the attribute.

In example embodiments, a database comprising the compressed column values and the dictionaries may be stored inside persistent storage devices of the storage system 107. In one example, at least part of the dictionaries $D1...Dn$ may be cached in the cache 114 of the storage system 107.

In various embodiments, the DBMS 109 may process queries against the tables $T1...TN$, which return result sets encoded in the corresponding character encoding $E1...En$. For example, the query execution can use a logical table representation of the tables $T1...TN$. For that, the query planner 110 may be configured to determine a query plan for each received query. For example, for processing a received query requiring a character encoding that is different from $E1...En$, the query planner 110 may be configured to invoke a conversion operation in order to convert the unencoded values Ci1, Ci2, . . . (e.g. by injecting dedicated conversion operators in one of the steps of the query plan).

Figure 2:
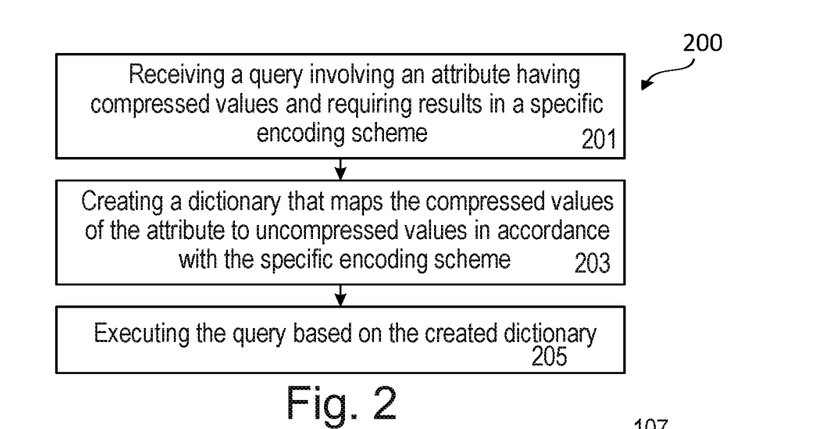
FIG. 2 is a flowchart of a method for providing character encoding, in accordance with embodiments of the present invention.

FIG. 2 is a flowchart of a method 200, for providing a dictionary, in accordance with embodiments of the present invention. For the purpose of explanation, the method 200 described in FIG. 2 may be implemented in the system illustrated in FIG. 1A, but execution of method 200 is not limited to this implementation. In example embodiments, computer system 101 can perform the method 200 of FIG. 2.

In step 201, the method 200 includes receiving a query. For example, the query may involve the attribute $Cx$ of the table $T1$. In one example, the attribute $Cx$ may be one of the attributes $C1...Cn$ for which a dictionary exists (e.g., $Cx = C1$). In various embodiments, the received query requires uncompressed values of the attribute $C1$, which are encoded in a specific encoding scheme $Ex$, which is different from the encoding scheme $E1$ that is provided for the attribute $C1$ in the metadata 125 of the table $T1$.

In another example, the query may involve an attribute $Cx = Cn+1$ of the table $T1$ that is not associated with a dictionary. In various embodiments, the received query requires uncompressed values of the attribute $Cn+1$, which are encoded in a specific encoding scheme $Ex$. However, the attribute $Cn+1$ has no associated dictionary in the metadata 125 of the table $T1$. That is, the uncompressed values of the attribute $Cn+1$ are not stored in the metadata 125 of the table $T1$. In example embodiments, the query may be the first query received in the system that requires values of the column $Cx$, in accordance with the encoding scheme $Ex$.

In response to receiving the query, in step 203 the method 200 can dynamically (or automatically) create a new dictionary. In one embodiment, the new dictionary maps compressed values of the attribute $Cx$ to corresponding uncompressed values that are encoded in accordance with the encoding scheme $Ex$.

In a first dictionary creation example, the method 200 (and computer system 101) can operate to create the new dictionary by determining the uncompressed values of all unique values of the attribute $Cx$, which can provide the new dictionary (named full dictionary) at once and may thus be subsequently used for other queries. For example, the full dictionary may be created as follows. When executing the query, the method 200 can determine result encoding(s) $Ex$, required by the query. Method 200 can further perform a check whether a dictionary with the required encoding $Ex$ exists. If no dictionary exists with the required encoding $Ex$, then a dictionary entry may be registered in the system so that concurrent queries that require the same dictionary may wait until the query finished dictionary creation (e.g., to avoid double work). Further, the method 200 can create the full dictionary by encoding all unique column values of the attribute $Cx$.

In additional aspects of the first dictionary creation example, the method 200 can store the full dictionary (e.g., in a cache). The other potentially waiting queries may be notified that the full dictionary is ready. Embodiments of the present invention recognize that using the cache may be advantageous, because existing cache management policies may be invoked to evict old dictionaries if necessary (e.g., if cache size exceeds a maximum size boundary). Further, in step 205 the method 200 can execute the query, using the full dictionary for deriving the result encoding.

In a second dictionary creation example, the method 200 (and computer system 101) can operate to create the new dictionary progressively. That is, the method 200 can dynamically determine and store the values of the attribute $Cx$ that are not part of the dictionary. For example, when executing the query, the method 200 can determine result encoding(s) $Ex$, required by the query. Further, the method 200 can perform a check whether a dictionary with the required encoding $Ex$ exists. If no dictionary exists with the required encoding $Ex$, the method 200 can create an empty dictionary to utilize during query processing.

Then, in the second dictionary example, the method 200 can get/retrieve the dictionary required by the query from the cache (which might be empty according to above) and the method 20 can execute the query. In various embodiments, the execution may involve a generation of conversion operators in the query plan if the physical column encoding ($e.g., E1$) does not match the result encoding $Ex$. For example, the uncompressed values required by the query in accordance with $Ex$ may not be in the dictionary. In addition, the method 200 can inject the retrieved dictionary into the conversion operator. For example, when evaluating the conversion operator for a column value, the method 200 can perform a lookup of the converted value inside the conversion dictionary. If the converted value is not found, the method 200 can execute the conversion operator and insert the converted value into the dictionary (for subsequent accesses by this query or other queries). Accordingly, the method 200 can return and/or provide the conversion result.

Figure 3:
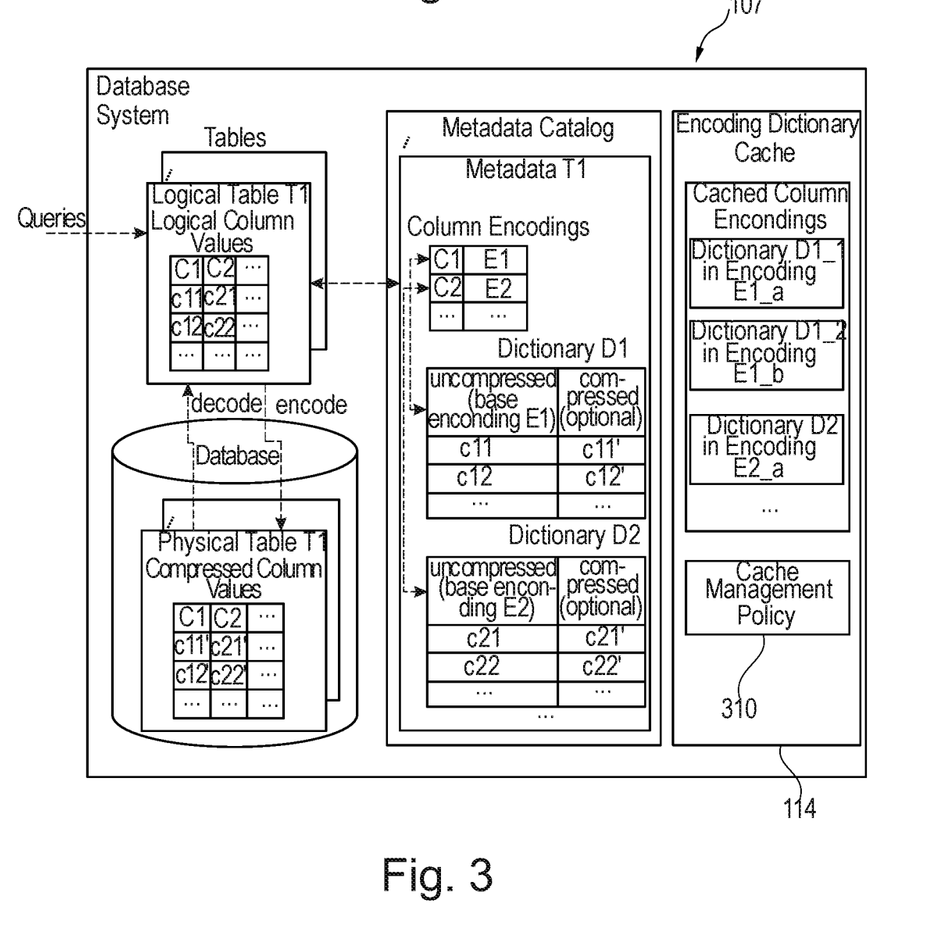
FIG. 3 is a diagram of a storage system, in accordance with embodiments of the present invention.

FIG. 3 is a diagram of a storage system for storing dynamically created dictionaries, in accordance with embodiments of the present invention. The storage system 107 of FIG. 3 includes the persistent content shown in FIG. 1B in addition to cached content of the cache 114. The cache 114 includes dictionaries associated with each character column $Ci$ of the table $T1$. For example, character column $C1$ is associated with two encoding schemes $E1\_a$ and $E1\_b$. For that association, two dictionaries D1_1 and D1_2 may be stored in the cache.

In various embodiments, the storage in the cache 114 may be managed using exiting cache management policies 310. For example, when storing a new dictionary in the cache 114, embodiments of the present invention can invoke cache management policies 310 to evict old dictionaries if necessary (e.g., if the cache size exceeds a maximum size boundary when adding the new dictionary).

In example embodiments, dynamically created dictionaries may be separately stored (and cached) in the storage system 107. In another example, dynamically created dictionaries may be implemented by extending the existing compression dictionaries with additional attributes. In this example, embodiments of the present invention can implement the cache by tracking and managing the dictionary attributes. Optionally, additional embodiments of the present invention can persist the dynamically created dictionaries to speedup queries after a database system crash.

Figure 4:
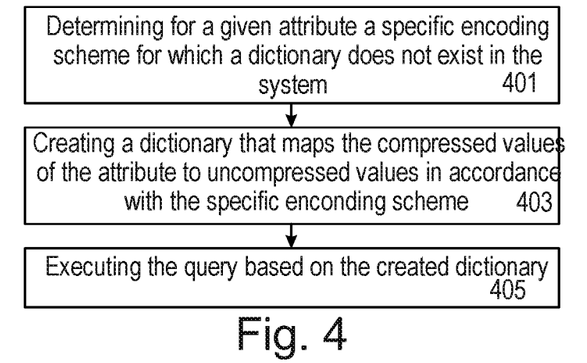
FIG. 4 is a flowchart of a method for providing character encoding, in accordance with embodiments of the present invention.

FIG. 4 is a flowchart of a method 400, for providing a dictionary, in accordance with embodiments of the present invention. In step 401, the method 400 can determine that a given attribute $Cx$ of the table $T1$ has compressed values and that the system does not include a dictionary for the compressed values into uncompressed values in accordance with at least one specific encoding scheme $Ex$. In one example, the attribute $Cx$ may be one of the attributes $C1...Cn$ for which a dictionary exists (e.g., $Cx=C1$). The specific encoding scheme $Ex$ is different from the encoding scheme $E1$ that is provided for the attribute $C1$ in the metadata 125 of the table $T1$.

Figure 5:
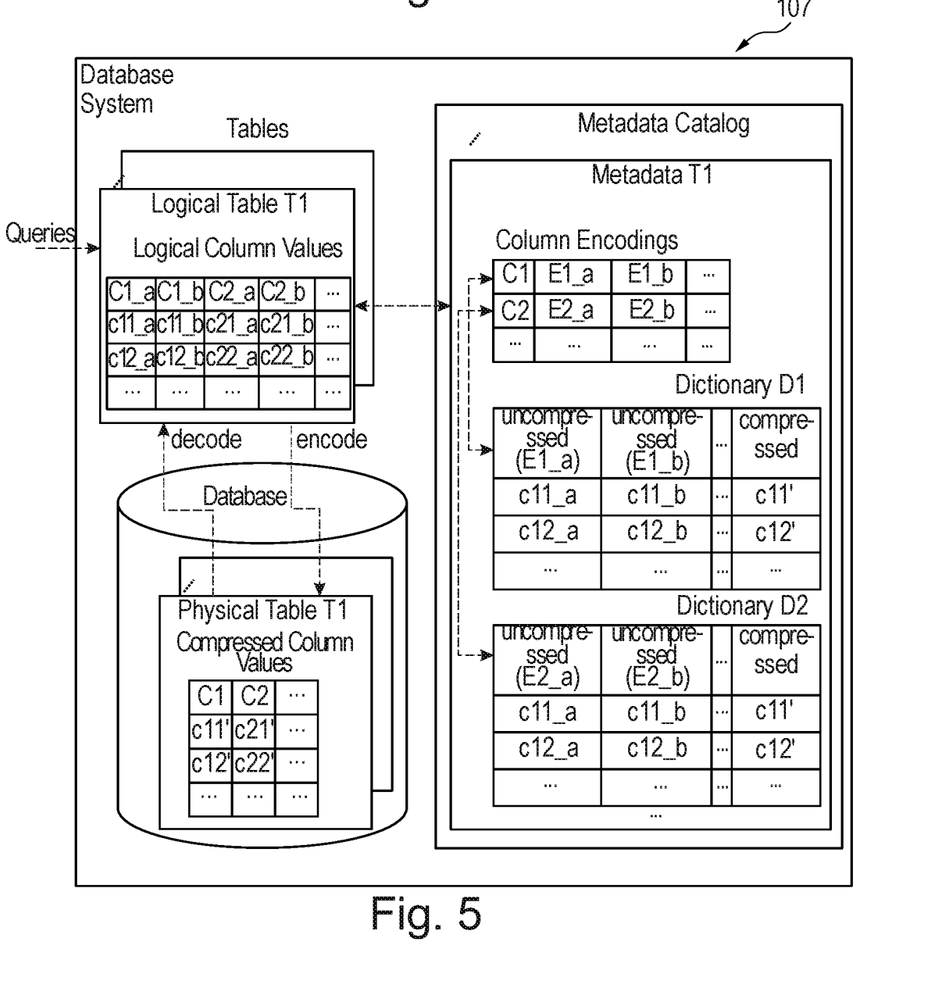
FIG. 5 is an example diagram of a storage system, in accordance with embodiments of the present invention.

In step 403, the method 400 can create a dictionary. The created dictionary maps compressed values of the attribute $Cx$ to corresponding uncompressed values that are encoded in accordance with the encoding scheme $Ex$. For example, if $Cx=C1$, the method 400 can extend the dictionary $D1$ by adding a new column that is associated with the specific encoding scheme $Ex$. That is, $D1$ may comprise one column of uncompressed values of the attribute $C1$, in accordance with the encoding scheme $E1$, and another column of uncompressed values of the attribute $C1$ in accordance with the encoding scheme $Ex$. The two columns are shown in FIG. 5, where $E1$ is referred to as $E1\_a$ and $Ex$ is referred to as $E1\_b$. Optionally, the dictionary $D1$ may further comprise a column of compressed values of the attribute $C1$.

In various embodiments, the method 400 can repeat steps 401 and 403 for one or more others new specific encoding schemes $Ex$ that are required for one or more attributes of the table T1. In example embodiments, repeating steps 401 and 403 can enable to further extent the dictionary $D1$ with one or more columns associated with further encoding schemes that may be used for processing values of the attribute $C1$.

In step 405, the method 400 can execute a query referencing the attribute $Cx$, using the created dictionary. That is, when a query now references a column in the different encoding scheme $Ex$, the decompression algorithm converts the compressed physical column values into the desired uncompressed version using the dictionary. Thereby, no additional query processing overheads may occur for converting one encoding to another using operators. For example, the execution of the query can include parsing query text of the query and determining desired result encoding for each column. If the desired result encoding is stored in one of the column dictionaries, then the query may be processed without additional re-encoding operation, directly accessing the values from the dictionary. Otherwise, the query may be processed by inserting additional conversion operations into the query plan.

FIG. 5 highlights the main aspects compared to FIG. 1B, in accordance with embodiments of the present invention. Each column Ci may now specify multiple encodings Ei. And, for each encoding Ei, the corresponding column dictionary is extended with another field for storing the uncompressed column value in encoding Ei.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer-implemented method comprising:
   receiving, by one or more processors, a first query involving one or more queried values of an attribute, wherein a queried value of the attribute being encoded in accordance with a first encoding scheme;
   identifying, by one or more processors, a table comprising values of the attribute in a compressed format;
   creating, by one or more processors, at least one new dictionary associated with the attribute, wherein the at least one new dictionary associated with the attribute maps a compressed value of the attribute in the table to a corresponding uncompressed value that is encoded in accordance with the first encoding scheme;
   executing, by one or more processors, the first query by invoking a conversion operation in a query plan of the first query for decoding the one or more queried values of the attribute;
   filling, by one or more processors, the at least one new dictionary with one or more decoded query values to create at least one full dictionary; and
   storing, by one or more processors, the at least one full dictionary in a cache using a predefined cache management policy of the cache for being utilized by future queries associated with the first encoding scheme.

2. The method of claim 1, further comprising:
   receiving, by one or more processors, a second query involving the attribute, wherein the second query utilizes the queried value encoded in accordance with the first encoding scheme;
   executing, by one or more processors, the second query.

3. The method of claim 2, wherein the executing the second query further comprises:
   determining, by one or more processors, whether the at least one full dictionary comprises the one or more queried values of the attribute;
   in response to determining that the at least one full dictionary does not comprise the one or more queried values, invoking, by one or more processors, a conversion operation in a query plan of the second query for decoding the one or more queried values and filling the at least one full dictionary with the decoded values; and
   in response to determining that the at least one full dictionary comprises the one or more queried values, obtaining, by one or more processors, the one or more queried values using the at least one full dictionary.

4. The method of claim 1, wherein the creating the at least one new dictionary associated with the attribute further comprises:
   encoding, by one or more processors, all unique values of the attribute of the table in accordance with the first encoding scheme; and
   storing, by one or more processors, at least the encoded values in the at least one new dictionary.

5. The method of claim 1, wherein the creating the at least one new dictionary associated with the attribute further comprises:
   pausing, by one or more processors, execution of one or more concurrent queries of the first query, the one or more concurrent queries involving the attribute; and
   in response to determining that the first query is finished, notifying, by one or more processors, the concurrent queries of existence of the at least one new dictionary.

6. The method of claim 1, wherein the creating the at least one new dictionary associated with the attribute further comprises:
   extending, by one or more processors, an existing dictionary by the at least one new dictionary, wherein the existing dictionary maps a compressed value of the attribute to a corresponding value that is encoded in accordance with the first encoding scheme.

7. The method of claim 1, further comprising:
   creating, by one or more processors, a second new dictionary, wherein the second new dictionary maps a compressed value of the attribute to a corresponding value that is encoded in accordance with a second encoding scheme.

8. A computer program product comprising:
   one or more computer readable storage media and program instructions stored on the one or more computer readable storage media, the program instructions comprising:
   program instructions to receive a first query involving one or more queried values of an attribute, wherein a queried value of the attribute being encoded in accordance with a first encoding scheme;
   program instructions to identify a table comprising values of the attribute in a compressed format;
   program instructions to create at least one new dictionary associated with the attribute, wherein the at least one new dictionary associated with the attribute maps a compressed value of the attribute in the table to a corresponding uncompressed value that is encoded in accordance with the first encoding scheme;
   program instructions to execute the first query by invoking a conversion operation in a query plan of the first query for decoding the one or more queried values of the attribute;
   program instructions to fill the at least one new dictionary with one or more decoded query values to create at least one full dictionary; and
   program instructions to store the at least one full dictionary in a cache using a predefined cache management policy of the cache for being utilized by future queries associated with the first encoding scheme.

9. The computer program product of claim 8, further comprising program instructions, stored on the one or more computer readable storage media, to:
   receive a second query involving the attribute, wherein the second query utilizes the queried value encoded in accordance with the first encoding scheme;
   execute the second query.

10. The computer program product of claim 9, wherein the program instructions to execute the second query further comprise program instructions to:

determine whether the at least one full dictionary comprises the one or more queried values of the attribute;

in response to determining that the at least one full dictionary does not comprise the one or more queried values, invoke a conversion operation in a query plan of the second query for decoding the one or more queried values and filling the at least one full dictionary with the decoded values; and in response to determining that the at least one full dictionary comprises the one or more queried values, obtain the one or more queried values using the at least one full dictionary.

11. The computer program product of claim 9, wherein the program instructions to create the at least one new dictionary associated with the attribute further comprise program instructions to:

encode all unique values of the attribute of the table in accordance with the first encoding scheme; and store at least the encoded values in the at least one new dictionary.

12. A computer system comprising:

one or more computer processors;

one or more computer readable storage media; and program instructions stored on the computer readable storage media for execution by at least one of the one or more processors, the program instructions comprising:

program instructions to receive a first query involving one or more queried values of an attribute, wherein a queried value of the attribute being encoded in accordance with a first encoding scheme;

program instructions to identify a table comprising values of the attribute in a compressed format;

program instructions to create at least one new dictionary associated with the attribute, wherein the at least one new dictionary associated with the attribute maps a compressed value of the attribute in the table to a corresponding uncompressed value that is encoded in accordance with the first encoding scheme;

program instructions to execute the first query by invoking a conversion operation in a query plan of the first query for decoding the one or more queried values of the attribute;

program instructions to fill the at least one new dictionary with one or more decoded query values to create at least one full dictionary; and program instructions to store the at least one full dictionary in a cache using a predefined cache management policy of the cache for being utilized by future queries associated with the first encoding scheme.

13. The computer system of claim 12, further comprising program instructions, stored on the computer readable storage media for execution by at least one of the one or more processors, to:

receive a second query involving the attribute, wherein the second query utilizes the queried value encoded in accordance with the first encoding scheme;

execute the second query.

14. The computer system of claim 13, wherein the program instructions to execute the second query further comprise program instructions to:

determine whether the at least one full dictionary comprises the one or more queried values of the attribute;

in response to determining that the at least one full dictionary does not comprise the one or more queried values, invoke a conversion operation in a query plan of the second query for decoding the one or more queried values and filling the at least one full dictionary with the decoded values; and in response to determining that the at least one full dictionary comprises the one or more queried values, obtain the one or more queried values using the at least one full dictionary.

15. The computer system of claim 12, wherein the program instructions to create the at least one new dictionary associated with the attribute further comprise program instructions to:

encode all unique values of the attribute of the table in accordance with the first encoding scheme; and store at least the encoded values in the at least one new dictionary.

16. The computer system of claim 12, wherein the program instructions to create the at least one new dictionary associated with the attribute further comprise program instructions to:

pause execution of one or more concurrent queries of the first query, the one or more concurrent queries involving the attribute; and in response to determining that the first query is finished, notify the concurrent queries of existence of the at least one new dictionary.

17. The computer system of claim 12, wherein the program instructions to create the at least one new dictionary associated with the attribute further comprise program instructions to:

extend an existing dictionary by the at least one new dictionary, wherein the existing dictionary maps a compressed value of the attribute to a corresponding value that is encoded in accordance with the first encoding scheme.

* * * * *